(12) United States Patent
Heigl et al.

(10) Patent No.: US 7,772,832 B2
(45) Date of Patent: Aug. 10, 2010

(54) MANIPULATOR FOR POSITIONING A TEST HEAD ON A TESTER

(76) Inventors: Helmuth Heigl, Anemonenstrasse 3e, Kolbermoor (DE) 80995; Hubertus Heigl, Georg-Pickl-Weg 5, Munchen (DE) 83059

( * ) Notice: Subject to any disclaimer, the term of this patent is extended or adjusted under 35 U.S.C. 154(b) by 62 days.

(21) Appl. No.: 12/130,181

(22) Filed: May 30, 2008

(65) Prior Publication Data

US 2008/0297141 A1 Dec. 4, 2008

(30) Foreign Application Priority Data

May 30, 2007 (DE) .................... 10 2007 024 949

(51) Int. Cl.
  *G01R 31/28* (2006.01)
(52) U.S. Cl. .................................. 324/158.1
(58) Field of Classification Search ......... None
  See application file for complete search history.

(56) References Cited

U.S. PATENT DOCUMENTS

| 6,766,996 | B1 | 7/2004 | Sommers | |
| 2004/0227534 | A1* | 11/2004 | Mueller | 324/758 |
| 2005/0194985 | A1* | 9/2005 | Heigl | 324/758 |
| 2006/0001416 | A1* | 1/2006 | West | 324/158.1 |
| 2006/0177298 | A1* | 8/2006 | Mueller | 414/791.2 |

FOREIGN PATENT DOCUMENTS

| DE | 35 26 137 C2 | 7/1986 |
| DE | 10 2004 008 487 A1 | 2/2004 |
| DE | 10 2004 026 031 B3 | 5/2004 |

* cited by examiner

*Primary Examiner*—Ha Tran T Nguyen
*Assistant Examiner*—Roberto Velez
(74) *Attorney, Agent, or Firm*—Brian B. Shaw, Esq.; Stephen B. Salai, Esq.; Harter Secrest & Emery LLP

(57) ABSTRACT

A manipulator for positioning a test head is provided with a positioning means by which the test head is three-dimensionally positionable and with a cradle to which the test head is securable and which is connected to the positioning means. The manipulator includes a compensator which can be loaded by the mass of the test head. The positioning means includes a column and at least one lead screw extending in the vertical direction. The compensator is connected to the cradle and can be moved by the lead screw in the vertical direction. The compensator includes a driver cooperating with the lead screw and is guided in the vertical direction on the column. The compensator has a spring element which is biased and supported by the driver.

25 Claims, 6 Drawing Sheets

MANIPULATOR FOR POSITIONING A TEST HEAD ON A TESTER

CROSS-REFERENCE TO RELATED APPLICATIONS

The present application claims priority under 35 USC §119 to previously filed German application 10200724949.9 filed May 30, 2007.

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

1. Field of the Invention

The invention relates to a manipulator, in particular for positioning a test head on a tester, comprising a positioning means by which the test head is three-dimensionally positionable. The manipulator features furthermore a cradle to which the test head is securable and which is connected to the positioning means. The invention furthermore relates to a compensator for application with one such manipulator and serving to compensate the mass of the test head.

A manipulator for positioning a test head normally has a plurality of translational and rotational degrees of freedom which allow for the test head to be precisely positioned three-dimensionally and to be positioned at a desired location. This is why, as a rule, such a manipulator finds application in testing electronic components such as, for instance, integrated circuits (ICs) or wafers. For function or quality testing electronic components it is necessary to precisely locate the relatively heavy test head at a tester. The tester, for example as a device handler or wafer prober, presents the electronic components to the test head for testing. Obtaining a genuine test result when testing electronic components requires precise docking of the test head at the tester. This is why precise, smooth adjustment of the manipulator positioning the test head is a mandatory requirement.

2. Description of Related Art

Smooth adjustment of the test head is obtained when the manipulator is provided with a compensator which compensates the mass of the test head. The compensator relieving the positioning means of the weight of the test head usually features a counterweight connected to the test head. Manipulators in which the mass of the test head is compensated by a counterweight are described, for instance, in German patents DE 36 17 741 C2 and DE 40 07 011 C2.

In addition German patent DE 10 2004 026 031 B3 discloses a manipulator permitting temporary loading of the test head to be docked on a tester to achieve reliable contacting of the tester. A manipulator provided with a fixed counterweight is described in U.S. Pat. No. 6,766,996 B1.

BRIEF SUMMARY OF THE INVENTION

The invention is based on the object of improving a manipulator for positioning a test head in a compact and reliable operational design.

The manipulator in accordance with the invention comprises a positioning means by which the test head is three-dimensionally positionable. The manipulator comprises furthermore a cradle to which the test head can be secured and which is connected to the positioning means. In addition, the manipulator features a compensator loadable by the mass of the test head. The positioning means comprises a column and at least one lead screw extending in the vertical direction. The compensator is connected to the cradle and can be moved by means of the lead screw in the vertical direction. The compensator comprises a driver cooperating with the lead screw and which is guided in the vertical direction on the column. In addition, the compensator comprises a spring element which is biased and supported by the driver.

The manipulator, in accordance with the invention, is based on having discovered how to compensate the mass of the test head not by a moveable counterweight but by a counterforce produced by a spring element. Thus, the manipulator may be designed with a relatively low weight in thus making for lower shipping costs. Unlike conventional manipulators in which the moveable counterweight needs to be balanced to the mass of the test head, the manipulator in accordance with the invention also features a universal configuration which now makes it possible to compensate the mass of a variety of test heads. For, now, the counterforce produced by the compensator to compensate the force of the weight of the test head concerned is solely a function of the excursion of the spring element caused by the corresponding force of the weight for a constant spring rate.

The force of the weight acting on the compensator materializes mainly from the mass of the test head, the mass of the cradle to which the test head is secured and the mass of a plate to which the cradle is secured. The spring element, which may be composed of a plurality of springs, where necessary, features a spring rate by which a force of the weight is generated which compensates the force of the weight acting on the securement means at least in part. For instance, the spring rate may be selected so that the counterforce generated by the spring element compensates just the component of the force of the weight produced by the mass of the test head. However, the component of the weight force resulting from the mass of the cradle and the mass of the mounting plate is in this case absorbed by the lead screw. It has, however, been discovered to be particularly an advantage to endow the spring element with a spring rate by which a counter force is generated which fully compensates the force of the weight acting on the compensator so that the compensator has smooth freedom of movement.

It has furthermore been discovered to particularly advantage to bias the spring element. This bias has the advantage that an excursion of the spring element does not occur until the force acting thereon exceeds the bias. This ensures precise motion of the test head by the positioning means. In addition to this, biasing the spring element permits tweaking the spring rate in thus achieving a compact design of the compensator.

Unlike prior art as it reads from U.S. Pat. No. 6,766,996 B1, the manipulator in accordance with the invention is additionally characterized by a reliable motion of the compensator in the vertical direction. This is particularly to be contributed to the fact that the driver cooperating with the lead screw is directly guided at the column, resulting in the compensator permitting precise vertical motion.

In addition the compensator ensures adequate compliance for docking the test head to, for example, a tester as needed in practice. On top of this, it is possible with the manipulator in accordance with the invention to load the tester temporary with the test head to achieve reliable contacting of the tester as is known from German patent DE 10 2004 026031 B3. For, when the spring rate is selected so that the counterforce generated by the spring element not fully compensates the mass of the test head, then the non-compensated component of the force of the weight of the test head is a load on the tester when the test head is docked.

Preferably the spring element is a compression spring, for example, a helical compression spring. Depending on the particular application the spring element may also be engineered as a tension spring.

In one preferred aspect the column is provided with at least one guide rail. The driver expediently involving a lead screw nut comprises a carriage guided by the guide rail. Guiding the car can be done by known ways and means, for example, by a linear bearing.

It is furthermore of advantage when the positioning means includes a mounting plate to which the cradle is secured. The mounting plate may be vertically guided on the column, if necessary, and provided with a plurality of holes permitting variable securement of the cradle.

In another aspect of the manipulator in accordance with the invention at least two lead screws, which are arranged parallel to each other, and at least two compensators are provided. Each lead screw is assigned a compensator. In this way the mass of the test head is compensated by two or more compensators.

Preferably, the compensator comprises a housing through which the lead screw extends and in which the spring element is arranged. The housing is expediently provided with an inspection window to permit checking the spring element to ascertain for example, the excursion of the spring element.

For simplified assembly it has been discovered to be of an advantage when the housing comprises an inner sleeve and an outer sleeve connected to the inner sleeve. Preferably, the inner sleeve is screwed into the outer sleeve to bias the spring element arranged in the inner sleeve. To facilitate screwing the inner sleeve into the outer sleeve the inner sleeve is expediently provided with a lug preferably configured in the form of a hexagon so that the inner sleeve can be turned by means of a hexagon wrench. To prevent the spring element being torsioned when screwing in the inner sleeve into the outer sleeve the spring element is preferably mounted rotatably in the inner sleeve by means of a thrust bearing.

Preferably, shiftably arranged in the housing is a clamping sleeve which is connected to the driver. The spring element engineered for example, as a helical compression spring is expediently supported by one end to the clamping sleeve and by the other end to the thrust bearing.

Expediently, the housing comprises at least one boss serving to support the spring element in the housing. In this case it has been discovered to be of advantage when the clamping sleeve comprises a stopper at which the spring element is supported and which in the biased condition of the spring element contacts the boss. Advantageously, the clamping sleeve comprises a connecting portion which connects the stopper and the driver to each other. To simplify assembly of the compensator the stopper and the connecting portion are preferably separate components. But, depending on the particular application the clamping sleeve composed of the stopper and connecting portion may be engineered in one piece.

Preferably, the inner sleeve comprises a face provided with a ramp. The ramp serves to center the clamping sleeve in the inner sleeve to prevent, for example, the stopper becoming jammed at the face when screwing the inner sleeve into the outer sleeve.

To secure the mounting plate or cradle to the compensator the housing is preferably connected to a securement sleeve. The securement sleeve is expediently fitted on the inner sleeve at the end facing away from the outer sleeve.

In another aspect of the manipulator in accordance with the invention the cradle comprises two side arms between which the test head is clampable. The side arms ensure reliable securement of the test head, even when it is relatively heavy.

BRIEF DESCRIPTION OF THE SEVERAL VIEWS OF THE DRAWING(S)

Details and further advantages of the invention read from the following description of a preferred aspect. The aspect is shown simply diagrammatically in the drawings in which:

FIG. 5b is a side view of the compensator as shown in FIG. 5a;

DETAILED DESCRIPTION OF THE INVENTION

Figure 1:
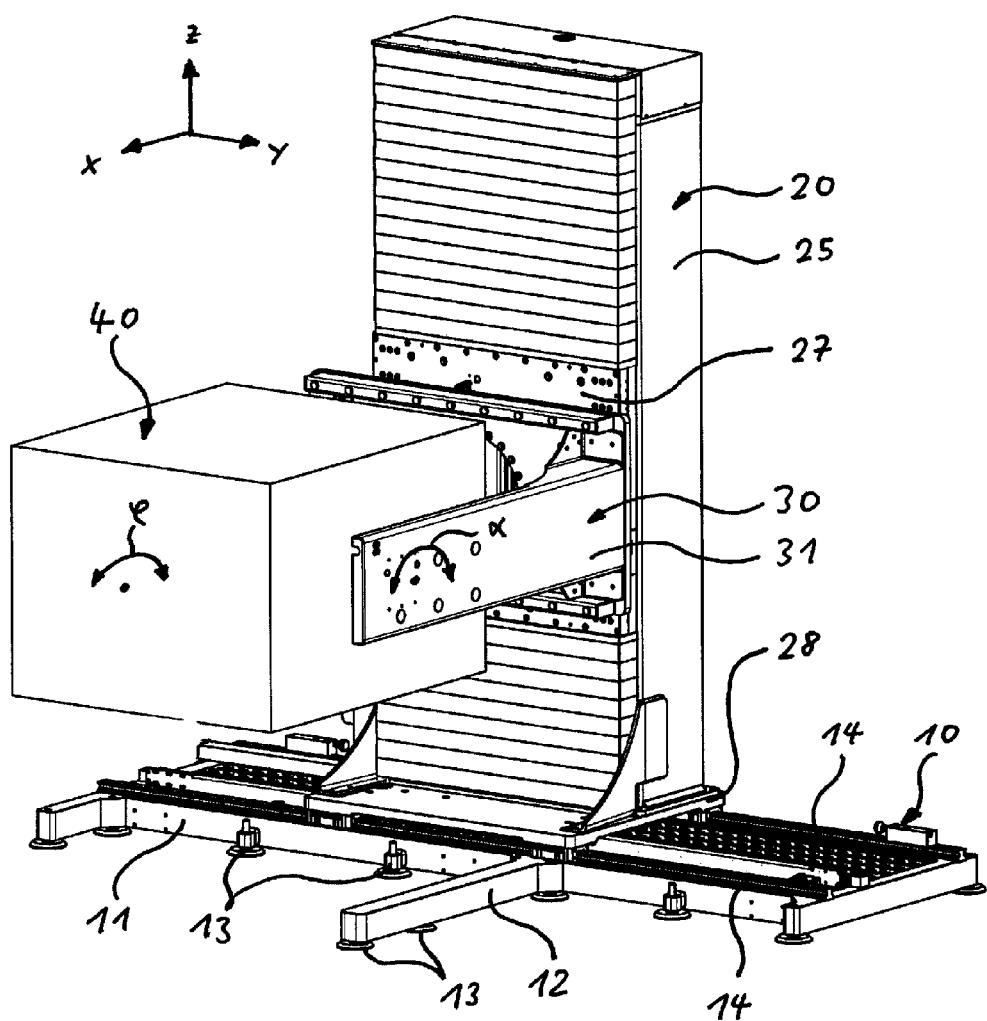
FIG. 1 is a view in perspective of a manipulator comprising a cradle to which a test head is secured.

Referring now to FIG. 1 there is illustrated the manipulator serving to position a test head 40 at a tester (not shown) for electronic components, such as, for example, ICs or wafers. For this purpose the manipulator comprises a positioning means 20 supported on a base 10 and connected to a cradle 30. The positioning means 20 comprises a vertical column 25 and two lead screws 21 extending parallel to each other in the vertical direction z, which are arranged within the column 25. The lead screws 21 as evident from FIG. 2 in particular are rotatably mounted with the aid of bearings 22 and connected with the aid of gears 23 to an electric motor 24. The electric motor 24 powers the lead screws 21 in synchronism.

The lead screws 21 are arranged on a horizontal carriage 28 which can be linearly displaced in a horizontal direction y on the base 10. Depending on the application a carousel may be arranged on the horizontal carriage 28 making it possible to rotate the lead screw 21 about an axis of rotation extending in the vertical direction z, as is known from German patent DE 101 32 489 B4. The base 10 comprises two supporting beams 11 extending in the horizontal direction y which are supported by cross members 12 extending in a horizontal direction x orthogonal to the horizontal direction y. To ensure safe standing of the manipulator even on an uneven surface the supporting beams 11 and the cross members 12 are mounted on height-adjustable feet plates 13. Arranged on the supporting beams 11 are guide rails 14 which serve to guide the horizontal carriage 28 in the horizontal direction y.

Figure 2:
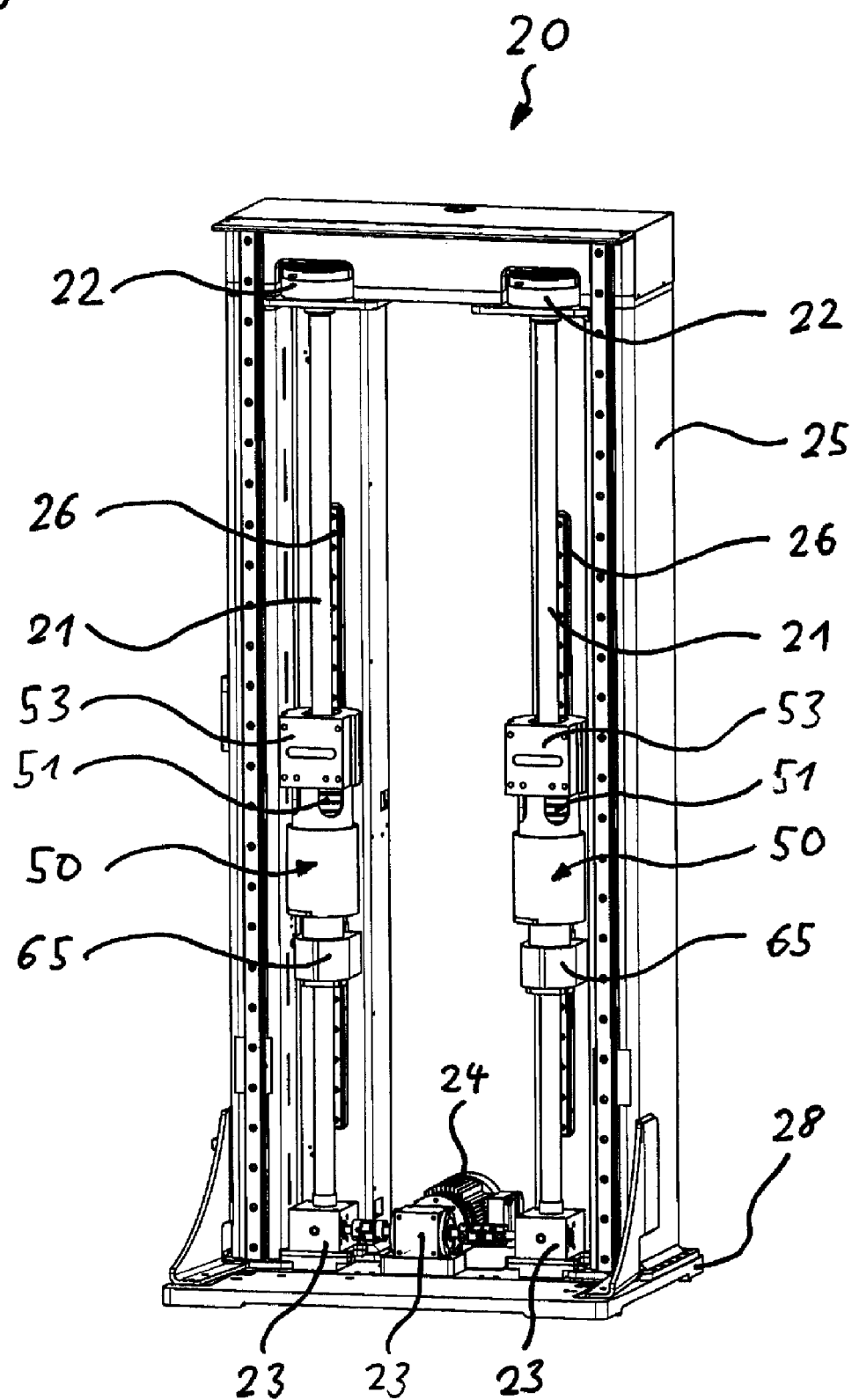
FIG. 2 is a view in perspective of a positioning means comprising two lead screws arranged in parallel.

Referring now to FIG. 2 there is illustrated furthermore how each lead screw 21 is assigned a compensator 50 which can be moved in the vertical direction z by the lead screw 21. A precise motion of the compensator 50 is ensured by a guide rail 26 arranged on the column 25 guiding the compensator 50 in the vertical direction z. The compensator 50 is connected to a mounting plate 27 to which the cradle 30 is secured.

Depending on the particular application the cradle 30 can be arranged rotatable at the mounting plate 27 to permit a twisting motion φ of the test head 40. The cradle 30 comprises two side arms 31 between which the test head 40 is clamped in place. The test head 40 can be clamped rotatably in place between the side arms 31 to achieve a so-called tumbling motion α of the test head 40.

Figure 3:
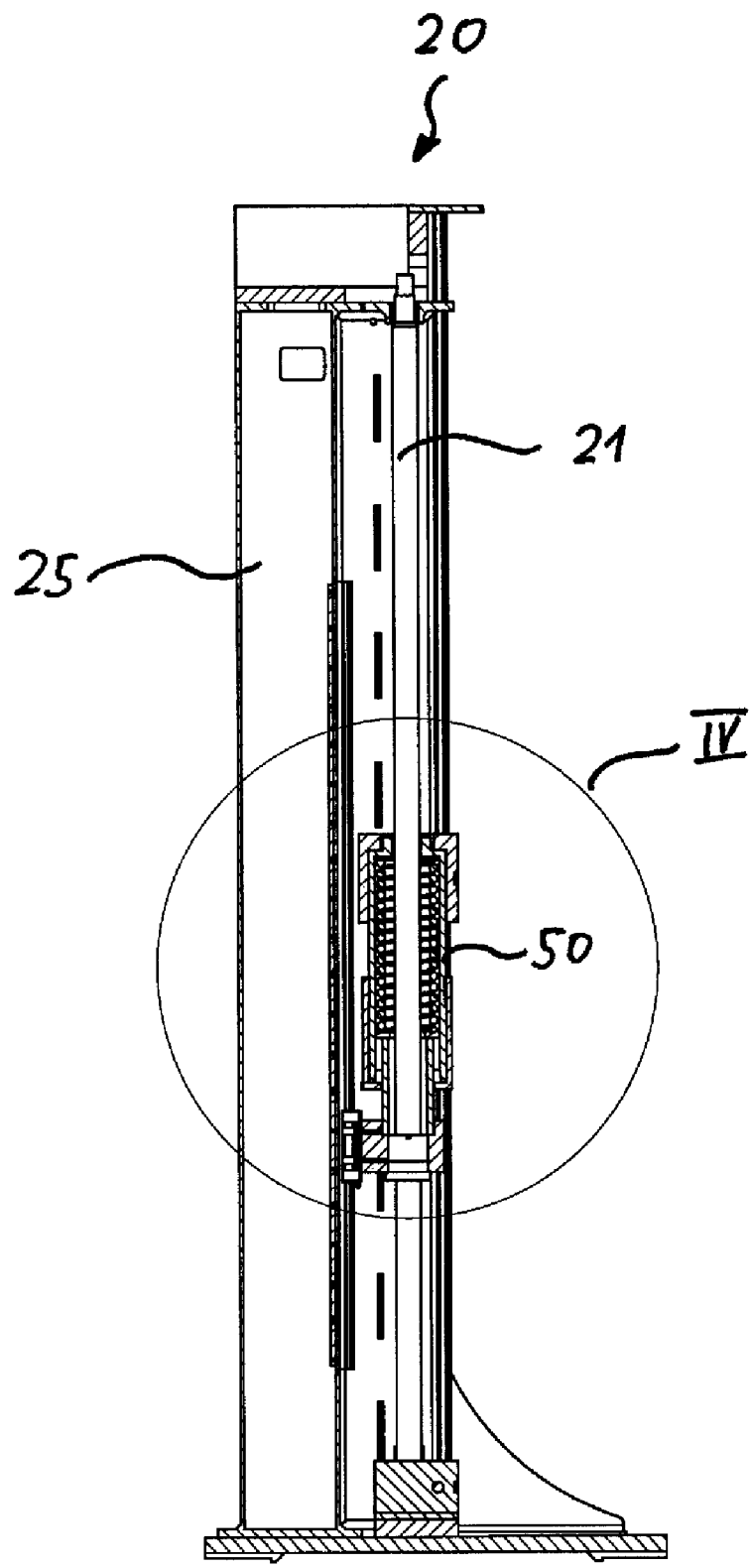
FIG. 3 is a side view of the positioning means as shown in FIG. 2.
Figure 4:
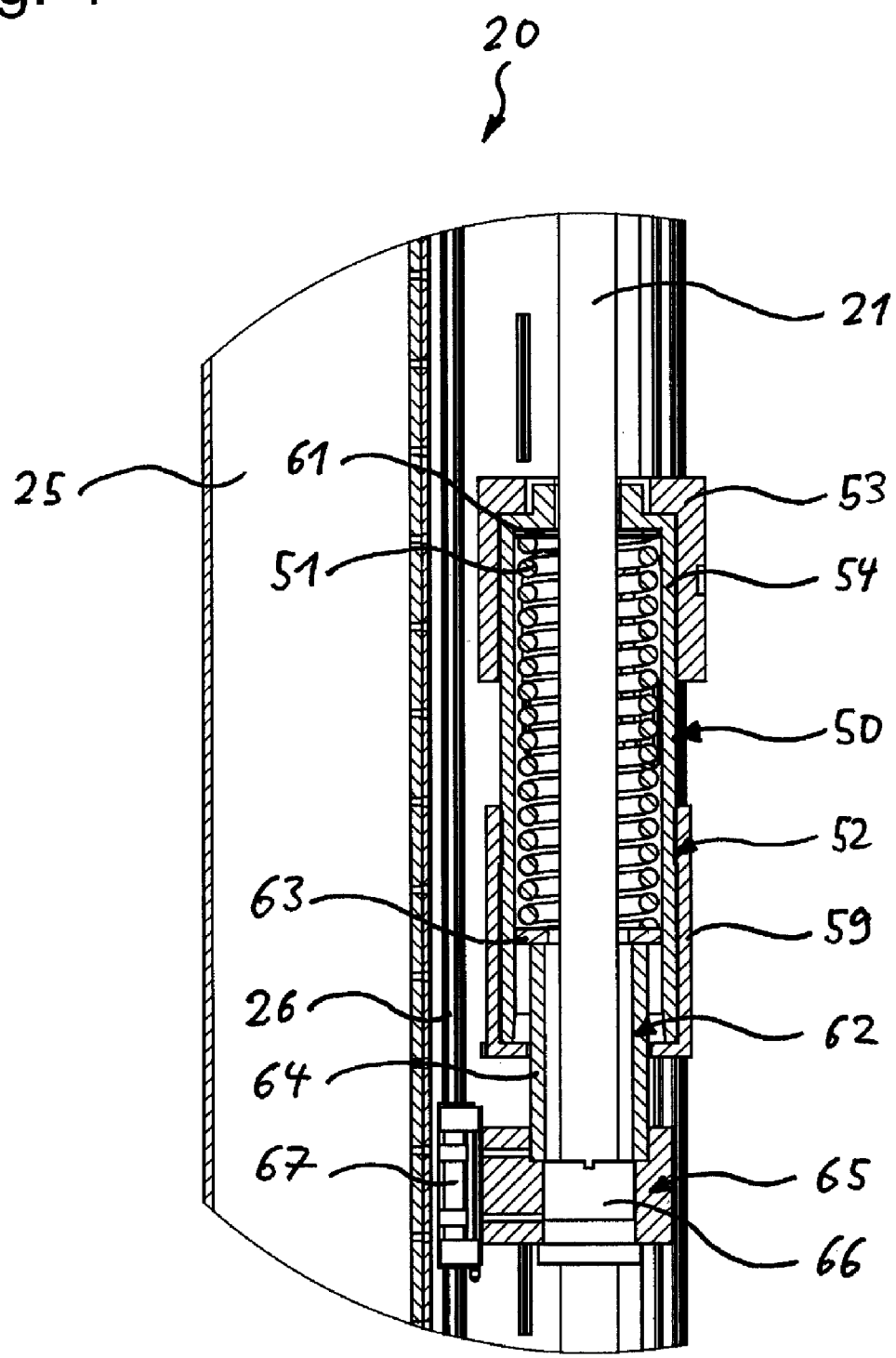
FIG. 4 is a magnified view of the portion identified IV in FIG. 3.
Figure 5A:
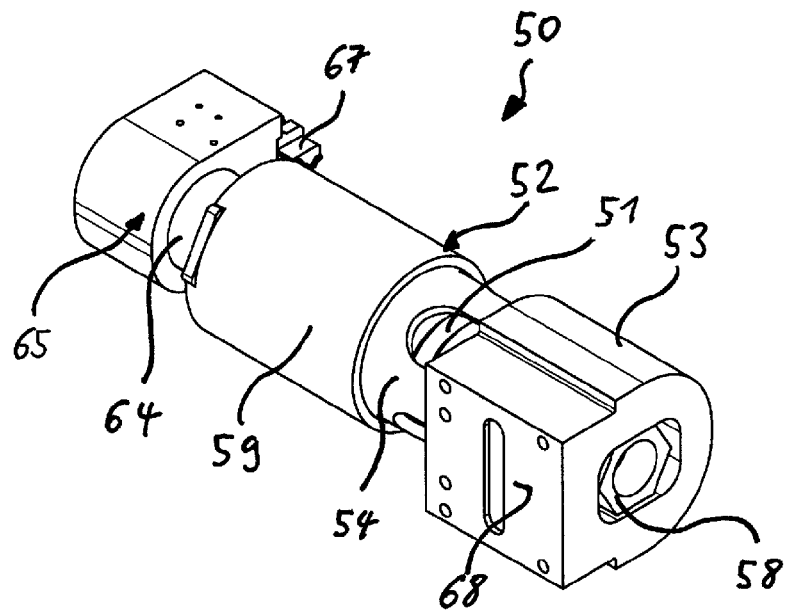
FIG. 5a is a view in perspective of a compensator.
Figure 5B:
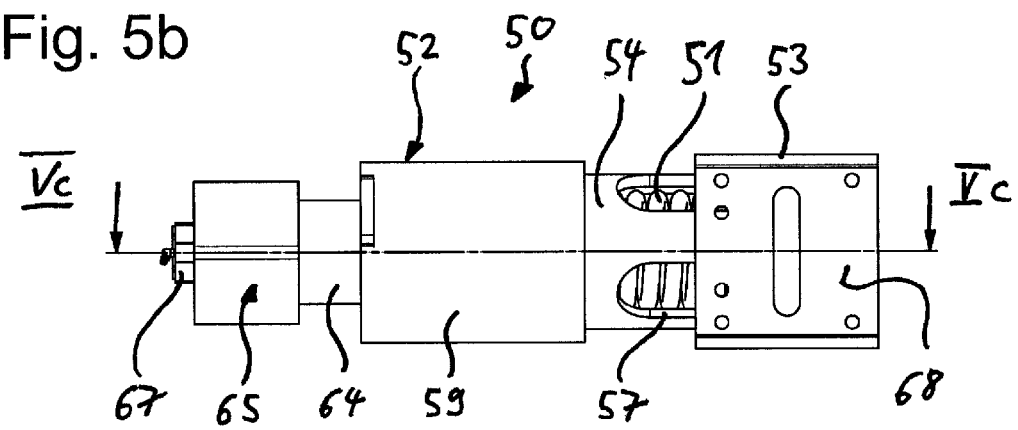
Figure 5C:
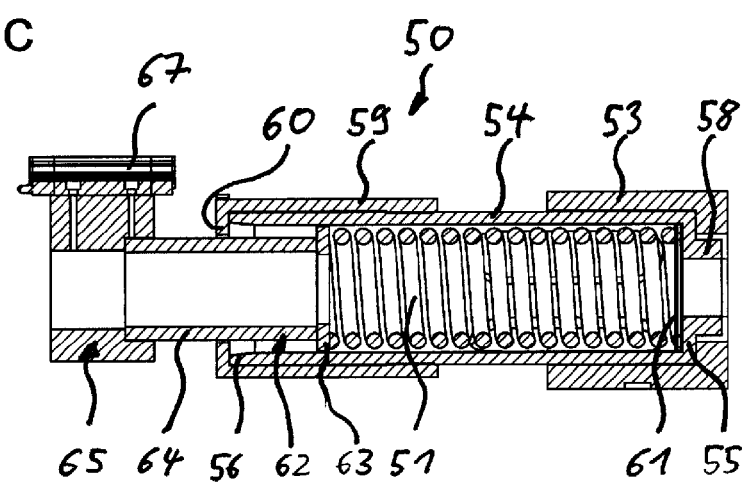
FIG. 5c is a section taken along the line Vc-Vc in FIG. 5b.

Referring now to FIGS. 3 and 4 there is illustrated in particular how the compensator 50 comprises a housing 52 through which the lead screw 21 extends. The housing 52 is composed of an inner sleeve 54 and an outer sleeve 59 as is evident in detail in FIGS. 5a to 5c. The inner sleeve 54 is provided with a male thread and the outer sleeve 59 with a female thread so that the inner sleeve 54 can be screwed into the outer sleeve 59. At the end facing away from the outer sleeve 59 the inner sleeve 54 features a boss 55 translating into a lug 58. As is particularly evident from FIG. 5a the lug 58 takes the form of a hexagon so that a conventional wrench can be used to screw the inner sleeve 54 into the outer sleeve 59. At the end facing away from the boss 55 the inner sleeve 54 features a face provided with a ramp 56. The inner sleeve 54 is provided in addition with a plurality of inspection windows 57 distributed along the circumference of the inner sleeve 54. The outer sleeve 59 comprises at the end facing away from the inner sleeve 54 a boss 60 which limits how far the inner sleeve 54 can be screwed in, as is particularly evident from FIG. 5c.

Arranged in the interior of the inner sleeve 54 is a spring element 51 engineered as a helical compression spring. The spring element 51 is supported at one end by a thrust bearing 61 in contact with the boss 55 and engineered, for example, as a needle bearing. The thrust bearing 61 results in the spring element 51 being rotatably mounted to prevent it from being torsioned when screwing the inner sleeve 54 into the outer sleeve 59. At the other end the spring element 51 is supported by a clamping sleeve 62 shiftably arranged in the inner sleeve 54. The clamping sleeve 62 is composed of a stopper 63 in contact with the spring element 51 and a connecting portion 64 arranged at the side of the stopper 63 facing away from the spring element 51. The stopper 63 is dimensioned so that it is in contact with the boss 60 of the outer sleeve 59 in the unloaded condition of the spring element 51. The tubular connecting portion 64, however, is dimensioned so that it projects through an opening formed in the boss 60 from the outer sleeve 59 and thus from the housing 52.

At the end facing away from the stopper 63 the connecting portion 64 is connected to a driver 65. The driver 65 comprises—as is evident from FIG. 4—a lead screw nut 66 which cooperates with the lead screw 21. The driver 65 in addition features a carriage 67 which cooperates with the guide rail 26 to guide the driver 65 and thus the compensator 50 in the vertical direction z.

Mounted on the inner sleeve 54 at the end facing away from the outer sleeve 59 is a securement sleeve 53. The securement sleeve 53 comprises—as is particularly evident from FIGS. 5a and 5b—a securement surface 68 to which the mounting plate 27 can be secured.

Figure 6A:
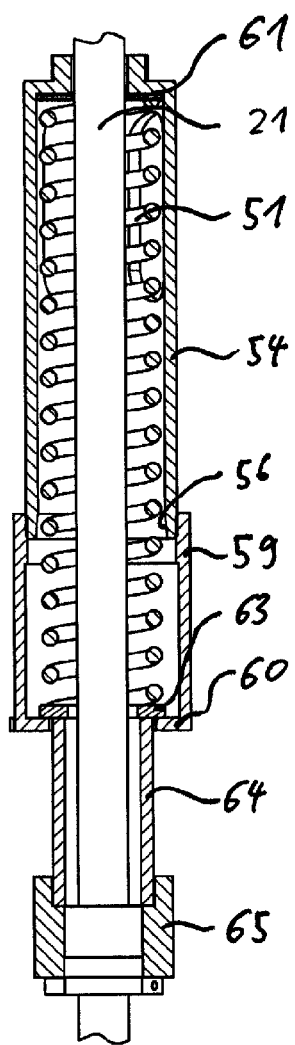
FIG. 6a is a longitudinal section through the compensator showing a spring element unloaded.
Figure 6B:
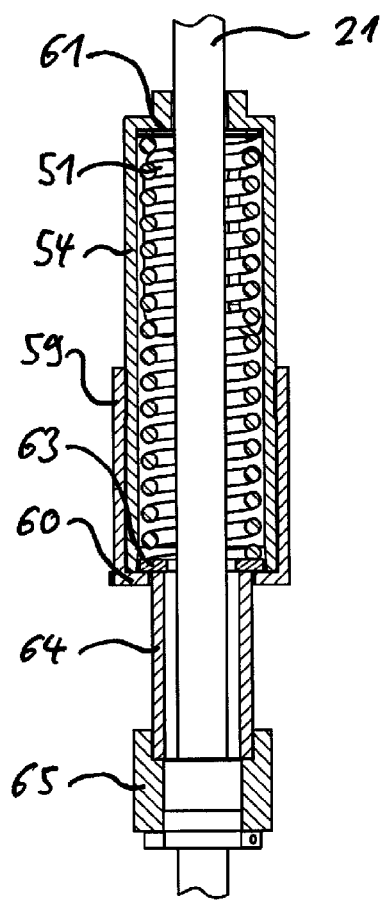
FIG. 6b is a longitudinal section as shown in FIG. 6a showing a spring element biased and FIG. 6c is a longitudinal section as shown in FIG. 6a showing a spring element loaded.

The spring element 51 is biased. Referring now to FIGS. 6a and 6b there is illustrated how bias is caused by screwing the inner sleeve 54 into the outer sleeve 59. Thus, the bias depends on how far screwing in is done so that it can be easily varied. Expediently the spring element 51 is, however, dimensioned so that the wanted bias is achieved when the face of the inner sleeve 54 comes into contact with the boss 60 of the outer sleeve 59, as is evident from FIG. 6b. The ramp 56 of the face of the inner sleeve 54 centers the stopper 63 to thus assure unobstructed motion of the stopper 63 in the inner sleeve 54.

The compensator 50 serves to achieve the compliancy as needed for docking the test head at the tester as required in practice and to compensate the mass of the test head 40 in ensuring smooth adjustment of the test head 40. Compensating the mass of the test head 40 is done by a counterforce generated by the spring element 51. As is particularly evident from FIG. 6c the force of the weight of the test head 40 engaging the inner sleeve 54 via the cradle 30, mounting plate 27 and securement sleeve 53 results in excursion of the spring element 51 by the spring element 51 being compressed in thus shifting the housing 52 in the direction of the driver 65. But excursion of the spring element 51 does not occur until the force engaging the inner sleeve 54 exceeds the bias of the spring element 51.

Figure 6C:
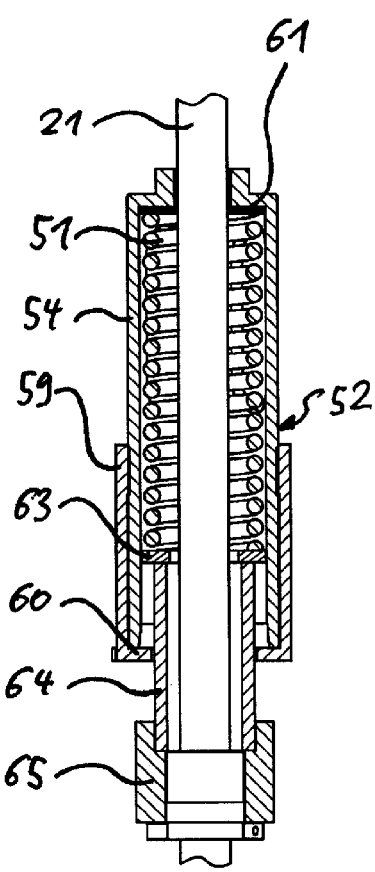

As a result of the mass of the test head 40 engaging the inner sleeve 54 excursion of the spring element 51 occurs, i.e. in the present case is compressed as is evident from FIG. 6c. The return force materializing in this way represents a counterforce which compensates the force of the weight engaging the compensator 50. The degree of compensation mainly depends on the spring rate of the spring element 51. By replacing the spring element 51 the compensator 50 can be adapted to differingly heavy test heads 40. This is, however, necessary only as an exception since with the spring rate constant any difference in the weight of the test head 40 simply produces a difference in excursion of the spring element 51. In other words, by suitably selecting the spring rate and the length of the connecting portion 64 dictating excursion a universal configuration is achievable, suitable for compensating the mass of all popular test heads 40. Last but not least, the manipulator as described above excels by its compact design and low total weight, because of the compensator 50 eliminating the need to provide a movable counterweight to compensate the mass of the test head 40.

| List of reference signs | |
| --- | --- |
| 10 | base |
| 11 | supporting beam |
| 12 | cross member |
| 13 | feet plate |
| 14 | guide rail |
| 20. | positioning means |
| 21 | lead screw |
| 22 | bearings |
| 23 | gears |
| 24 | motor |
| 25 | column |
| 26 | guide rail |
| 27 | mounting plate |
| 28 | horizontal carriage |
| 30 | cradle |
| 31 | side arm |
| 40 | test head |
| 50 | compensator |
| 51 | spring element |
| 52 | housing |
| 53 | securement sleeve |
| 54 | inner sleeve |
| 55 | boss |
| 56 | ramp |
| 57 | inspection window |
| 58 | lug |
| 59 | outer sleeve |
| 60 | boss |
| 61 | thrust bearing |
| 62 | clamping sleeve |
| 63 | stopper |
| 64 | connecting portion |
| 65 | driver |
| 66 | lead screw nut |

-continued

List of reference signs

| | |
|---|---|
| 67 | carriage |
| 68 | securement surface |
| x | first horizontal direction |
| y | second horizontal direction |
| z | vertical direction |
| φ | twisting motion |
| α | tumbling motion |

The invention claimed is:

1. A manipulator for positioning a test head on a tester, the manipulator comprising:
   positioning means for three-dimensionally positioning the test head;
   a cradle connected to the positioning means and secured to the test head;
   a compensator loadable by a weight of the test head;
   the positioning means comprising a column and at least one lead screw extending in a vertical direction;
   the compensator being connected to the cradle and being moveable by the lead screw in the vertical direction; and
   the compensator comprising a driver cooperating with the lead screw and which is guided in the vertical direction on the column, and a spring element which is biased and supported by the driver, wherein the compensator includes a housing through which the lead screw extends and in which the spring element is disposed, wherein the housing comprises an inner sleeve and an outer sleeve connected to the inner sleeve,
   wherein the inner sleeve threadingly engages the outer sleeve, and the outer sleeve includes a lug.

2. A manipulator for positioning a test head on a tester, the manipulator comprising:
   positioning means for three-dimensionally positioning the test head;
   a cradle connected to the positioning means and secured to the test head;
   a compensator loadable by a weight of the test head;
   the positioning means comprising a column and at least one lead screw extending in a vertical direction;
   the compensator being connected to the cradle and being moveable by the lead screw in the vertical direction, the compensator comprising a driver cooperating with the lead screw and which is guided in the vertical direction on the column, and a spring element which is biased and supported by the driver, wherein the compensator includes a housing through which the lead screw extends and in which the spring element is disposed, wherein the housing comprises an inner sleeve and an outer sleeve connected to the inner sleeve; and
   a thrust bearing rotatably mounting the spring element in the inner sleeve.

3. A manipulator for positioning a test head on a tester, the manipulator comprising:
   positioning means for three-dimensionally positioning the test head;
   a cradle connected to the positioning means and secured to the test head;
   a compensator loadable by a weight of the test head;
   the positioning means comprising a column and at least one lead screw extending in a vertical direction;
   the compensator being connected to the cradle and being moveable by the lead screw in the vertical direction and the compensator comprising a driver cooperating with the lead screw and which is guided in the vertical direction on the column, and a spring element which is biased and supported by the driver, wherein the compensator includes a housing through which the lead screw extends and in which the spring element is disposed; and
   a clamping sleeve connected to the driver, wherein the spring element is supported by the clamping sleeve.

4. The manipulator as set forth in claim 3, wherein the spring element has a spring rate which generates a counterforce corresponding to weight of the test head loading the compensator.

5. The manipulator as set forth in claim 3, wherein the spring element is a compression spring.

6. The manipulator as set forth in claim 3, wherein the column is provided with at least one guide rail and the driver comprises a carriage guided by the guide rail.

7. The manipulator as set forth in claim 3, wherein the positioning means includes a mounting plate to which the cradle is secured.

8. The manipulator as set forth in claim 3, wherein at least two lead screws are arranged parallel to each other, each lead screw including a compensator.

9. The manipulator as set forth in claim 3, wherein the housing includes an inspection window.

10. The manipulator as set forth in claim 3, wherein the housing comprises an inner sleeve and an outer sleeve connected to the inner sleeve.

11. The manipulator as set forth in claim 10, wherein the inner sleeve comprises a face having a ramp.

12. The manipulator as set forth in claim 3, wherein the cradle comprises two side arms, the test head being intermediate the side arms.

13. A manipulator for positioning a test head on a tester, the manipulator comprising:
    positioning means for three-dimensionally positioning the test head;
    a cradle connected to the positioning means and secured to the test head;
    a compensator loadable by a weight of the test head;
    the positioning means comprising a column and at least one lead screw extending in a vertical direction;
    the compensator being connected to the cradle and being moveable by the lead screw in the vertical direction; and
    the compensator comprising a driver cooperating with the lead screw and which is guided in the vertical direction on the column, and a spring element which is biased and supported by the driver, wherein the compensator includes a housing through which the lead screw extends and in which the spring element is disposed,
    wherein the housing includes at least one boss and a clamping sleeve includes a stopper supporting the spring element, the stopper contacting the boss in response to a biased condition of the spring element.

14. The manipulator as set forth in claim 13, wherein the clamping sleeve comprises a connecting portion which connects the stopper to the driver.

15. A manipulator for positioning a test head on a tester, the manipulator comprising:
    positioning means for three-dimensionally positioning the test head;
    a cradle connected to the positioning means and secured to the test head;
    a compensator loadable by a weight of the test head;
    the positioning means comprising a column and at least one lead screw extending in a vertical direction;
    the compensator being connected to the cradle and being moveable by the lead screw in the vertical direction and the compensator comprising a driver cooperating with the lead screw and which is guided in the vertical direction on the column, and a spring element which is biased and supported by the driver, wherein the compensator includes a housing through which the lead screw extends and in which the spring element is disposed, wherein the housing is connected to a securement sleeve, and further comprising a mounting plate secured to the securement sleeve.

16. A manipulator for positioning a test head on a tester, the manipulator comprising:

positioning means for three-dimensionally positioning the test head;

a cradle connected to the positioning means and secured to the test head;

a housing connectable to the cradle;

a driver cooperating with a lead screw and guided in a vertical direction;

a spring element disposed in the housing, the spring element being biased and supported by the driver;

wherein the housing comprises an inner sleeve and an outer sleeve connected to the inner sleeve; and the inner sleeve threadingly engages the outer sleeve, and the outer sleeve includes a lug.

17. The manipulator as set forth in claim 16, wherein the spring element has a spring rate which generates a counterforce corresponding to the weight of the test head.

18. The manipulator as set forth in claim 16, wherein the housing includes an inspection window.

19. The manipulator as set forth in claim 16, wherein the inner sleeve comprises a face having a ramp.

20. A manipulator for positioning a test head on a tester, the manipulator comprising:

positioning means for three-dimensionally positioning the test head;

a cradle connected to the positioning means and secured to the test head;

a housing connectable to the cradle;

a driver cooperating with a lead screw and guided in a vertical direction;

a spring element disposed in the housing, the spring element being biased and supported by the driver;

wherein the housing comprises an inner sleeve and an outer sleeve connected to the inner sleeve; and a thrust bearing rotatably mounting the spring element in the inner sleeve.

21. A manipulator for positioning a test head on a tester, the manipulator comprising:

positioning means for three-dimensionally positioning the test head;

a cradle connected to the positioning means and secured to the test head;

a housing connectable to the cradle;

a driver cooperating with a lead screw and guided in a vertical direction;

a spring element disposed in the housing, the spring element being biased and supported by the driver; and a clamping sleeve connected to the driver, wherein the spring element is supported by the clamping sleeve.

22. The manipulator as set forth in claim 21, wherein the housing includes at least one boss.

23. A manipulator for positioning a test head on a tester, the manipulator comprising:

positioning means for three-dimensionally positioning the test head;

a cradle connected to the positioning means and secured to the test head;

a housing connectable to the cradle;

a driver cooperating with a lead screw and guided in a vertical direction;

a spring element disposed in the housing, the spring element being biased and supported by the driver;

wherein the housing includes at least one boss; and wherein a clamping sleeve includes a stopper supporting the spring element, the stopper contacting the boss in response to a biased condition of the spring element.

24. The manipulator as set forth in claim 23, wherein the clamping sleeve comprises a connecting portion which connects the stopper to the driver.

25. A manipulator for positioning a test head on a tester, the manipulator comprising:

positioning means for three-dimensionally positioning the test head;

a cradle connected to the positioning means and secured to the test head;

a housing connectable to the cradle;

a driver cooperating with a lead screw and guided in a vertical direction; and a spring element disposed in the housing, the spring element being biased and supported by the driver, wherein the housing is connected to a securement sleeve, and further comprising a mounting plate secured to the securement sleeve.

* * * * *